US007964798B2

(12) United States Patent
Negle et al.

(10) Patent No.: US 7,964,798 B2
(45) Date of Patent: Jun. 21, 2011

(54) ELECTRICAL HIGH FIELD/HIGH VOLTAGE UNIT AND METHOD OF MANUFACTURING SAME

(75) Inventors: Hans Negle, Nahe (DE); Alfred Sachsse, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 1024 days.

(21) Appl. No.: 11/718,726

(22) PCT Filed: Nov. 7, 2005

(86) PCT No.: PCT/IB2005/053649
§ 371 (c)(1),
(2), (4) Date: May 7, 2007

(87) PCT Pub. No.: WO2006/051474
PCT Pub. Date: May 18, 2006

(65) Prior Publication Data

US 2008/0041612 A1 Feb. 21, 2008

(30) Foreign Application Priority Data

Nov. 11, 2004 (EP) .................................... 04105695

(51) Int. Cl.
*H05K 7/12* (2006.01)
*H01B 17/60* (2006.01)

(52) U.S. Cl. ............ 174/138 G; 174/138 R; 174/137 R; 174/520; 361/601; 361/679.01; 361/796

(58) Field of Classification Search .............. 174/138 G, 174/138 R, 137 R, 50, 521, 17 R, 17 LF, 174/17 GF, 37, 17.08, 520, 559, 110 F; 361/600, 361/601, 603, 604, 611, 620, 623, 641, 659, 361/663, 679.01, 763, 766, 796, 807, 836; 378/193, 199, 200
See application file for complete search history.

(56) References Cited

U.S. PATENT DOCUMENTS 3,193,426 A * 7/1965 Schafer ...................... 174/110 F
(Continued)

FOREIGN PATENT DOCUMENTS

WO WO9608020 3/1996

OTHER PUBLICATIONS

N. Gupta et al., "Comparison of Compressive Properties of Layered Syntactic Forms Having Gradient in Microballoon Volume Fraction and Wall Thickness", Material Science and Engineering A. vol. 427, No. 1-2, 2006, pp. 331-342.

*Primary Examiner* — Angel R Estrada

(57) ABSTRACT

A high field/high voltage unit comprising at least one electrical component (4) and a solid insulating material (20) in the form of a first and a second piece part (10, 11) which form, in particular, hard foam half bodies and a method of manufacturing same is disclosed. The piece parts (10, 11) each have an inner structure comprising a plurality of preformed cavities (3) in which electrical components (4) are fixed. After assembly, the piece parts (10, 11) form a closed casing of the high field/high voltage unit so that no extra steel vessel is necessary. Conductive paths (5, 6) for the interconnection of the components are integrated into the insulating material (20) using for example an insert technology. Since several functions can thus be integrated into the solid insulating material (20), a simple solution for assembling and disassembling an oil/gas filled high field/high voltage unit like a high voltage generator for an X-ray tube is realized.

14 Claims, 1 Drawing Sheet

U.S. PATENT DOCUMENTS

Figure 1:
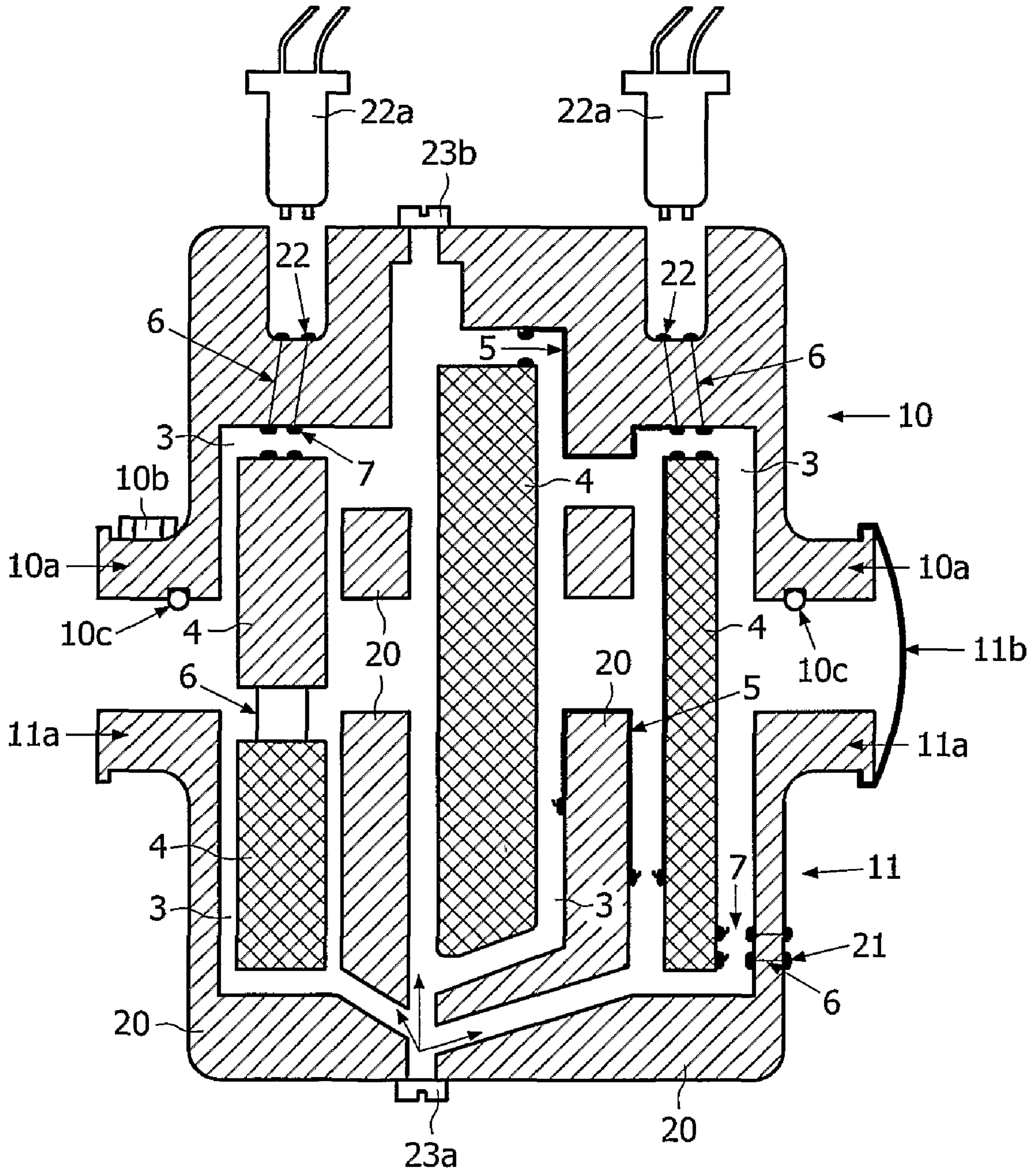

| | | | | |
|---|---|---|---|---|
| 3,544,938 | A * | 12/1970 | Ritter et al. | 174/18 |
| 3,575,546 | A * | 4/1971 | Liautaud | 174/521 |
| 3,599,134 | A * | 8/1971 | Galloway | 174/50 |
| 3,644,858 | A * | 2/1972 | Galloway | 174/17 LF |
| 3,670,091 | A | 6/1972 | Frantz et al. | |
| 3,709,835 | A | 1/1973 | Forster | |
| 3,710,002 | A * | 1/1973 | Link | 174/18 |
| 3,801,727 | A * | 4/1974 | Wilkinson et al. | 174/50 |
| 3,825,148 | A * | 7/1974 | Hunter et al. | 174/37 |
| 3,910,448 | A * | 10/1975 | Evans et al. | 174/50 |
| 4,109,098 | A | 8/1978 | Olsson et al. | |
| 4,190,732 | A * | 2/1980 | Galloway et al. | 174/50 |
| 4,219,791 | A | 8/1980 | Moore et al. | |
| 4,318,258 | A | 3/1982 | Heck | |
| 4,412,029 | A | 10/1983 | Kehr et al. | |
| 4,920,554 | A * | 4/1990 | Gabbay et al. | 378/200 |
| 5,232,775 | A | 8/1993 | Chamberlain et al. | |
| 5,739,464 | A * | 4/1998 | Adkins et al. | 174/50 |
| 5,756,936 | A | 5/1998 | Viebranz et al. | |
| 6,265,656 | B1 * | 7/2001 | Berth | 174/50 |
| 6,498,303 | B2 | 12/2002 | Negle | |
| 6,541,534 | B2 | 4/2003 | Allen et al. | |
| 2006/0185889 | A1 | 8/2006 | Negle | |

* cited by examiner

ELECTRICAL HIGH FIELD/HIGH VOLTAGE UNIT AND METHOD OF MANUFACTURING SAME

The invention relates to an electrical high field/high voltage unit comprising at least one electrical component and a solid insulating material. Such a unit can be a high voltage unit, especially a high voltage generator e.g. for an X-ray system or a computer tomograph, as well as a low voltage unit comprising e.g. electrical components or conductors which are positioned at small distances from each other, so that an insulating material has to be provided for avoiding breakdowns/flashovers between these components.

The invention further relates to an X-ray system or computer tomography system comprising a high field/high voltage unit.

EP 1 176 856 discloses a high voltage generator with a casing in which a plurality of electrical components and a hybrid insulation are provided. The insulation comprises a hard foam which is formed to enclose cavities for the electrical components and related connections and to provide channels through which a liquid or gaseous insulating material, preferably a transformer oil, is fed in order to increase cooling of individual components.

While this generator can be formed so as to have small dimensions and a low weight in combination with a high electrical strength and a high output power, a disadvantage resides in the fact that the manufacture of such a generator requires numerous steps and is rather expensive, because several different parts of the insulation material have to be formed and assembled together, including the electrical components and related connections, before finally filling in the insulating fluid or gas.

It is a general object of the invention to provide a construction for a high field/high voltage unit as mentioned above, which is simpler and which can be realized easier and faster.

Especially, it is an object of the invention to provide a high field/high voltage unit comprising at least one electrical component and a solid insulating material, which has a simpler construction and incorporates fewer parts to be assembled.

According to the invention, these objects are achieved by a high field/high voltage unit comprising at least one electrical component and a solid insulating material which is formed to provide an outer shell or vessel of the high field/high voltage unit and which has an inner structure comprising at least one first cavity for accommodating the at least one electrical component.

One advantage of this solution is that by providing a solid insulating material in the form of a shell or vessel of the high field/high voltage unit no separate steel vessel is necessary anymore.

By this, and by inserting the electrical components into adapted cavities, the assembly of the high field/high voltage unit is considerably easier and faster and can be conducted to a considerable extent by machines, partly because no separate component carriers are necessary anymore, and the costs are decreased accordingly.

In a preferred embodiment of a high field/high voltage unit according to the invention, the inner structure comprises at least one second cavity for containing a fluid and/or a gaseous insulating material, wherein the shell or vessel is provided in the form of a liquid and/or a gas-tight casing. Providing second cavities e.g. in the form of channels for guiding a liquid or gaseous insulating material leads to considerable advantages with respect to increased voltage strength, cooling, weight reduction, small dimensions and high output power.

In a preferred embodiment of a high field/high voltage unit according to the invention, the insulating material is a hard foam which comprises a plurality of substantially spherical particles with a diameter of up to about 100 μm. This insulating material has the advantage that, on the one hand, the electrical conductivity and/or the dielectric constant of the material can be adapted or changed according to an actual field load of the material in certain areas, so that voltage drops that occur during operation of the high field/high voltage unit remain below flashover and/or breakdown voltages of the insulating material. On the other hand, the stability and mechanical strength of the insulating material can be increased, so that the high field/high voltage unit can be subjected to a high dynamic load, like in rotary X-ray systems or computer tomography systems.

In a preferred embodiment of a high field/high voltage unit according to the invention, the shell or vessel is composed at least of a first piece part and a second piece part which are assembled together to form a casing. In a further preferred embodiment of a high field/high voltage unit according to the invention, the at least one first cavity is dimensioned for press fitting or snap mounting the at least one electrical component. These embodiments are especially advantageous with respect to a simple and fast assembly.

In a preferred embodiment of a high field/high voltage unit according to the invention, the at least one component is an active and/or passive electrical component like a transformer, a capacitor, a voltage divider, a rectifier, a resistor or a conductor, or a mold unit or an integrated or hybrid circuit comprising at least one such active and/or passive electrical component.

In a preferred embodiment of a high field/high voltage unit according to the invention, at least one at least partly conductive interconnection is provided within the casing for electrically connecting the electrical components. In a further preferred embodiment of a high field/high voltage unit according to the invention, the interconnection is provided by an at least partly conducting material on the inner surface of and/or within the insulating material. In a further preferred embodiment of a high field/high voltage unit according to the invention, the interconnection is provided by a metal stick or wire which is inserted into the insulating material. In a further preferred embodiment of a high field/high voltage unit according to the invention, the interconnection is provided in the form of at least one flexible printed circuit board and/or a flexible conductive foil which is fixed on the inner surface of the insulating material and/or which runs through it. These embodiments provide simple electrical interconnections for the electrical components.

In a preferred embodiment of a high field/high voltage unit according to the invention, contact areas are provided within the at least one first cavity for electrically contacting the at least one electrical component. This embodiment enables very simple electrical contacting or bonding of the electrical components.

An X-ray system or computer tomography system according to the invention comprises a high field/high voltage unit according to the invention.

Further details, features and advantages of the invention are disclosed in the following description of an exemplary, preferred embodiment of the invention with reference to the drawings, in which:

FIG. 1 shows a simplified cross section through such an embodiment.

The preferred embodiment according to FIG. 1 comprises a closed and sealed shell or vessel in the form of a casing which is composed of a first piece part 10 and a second piece part 11 of a solid insulating material 20, which provide the outer surface and contour of the casing as well as inner cavities adapted for enclosing and fixing electrical components and for providing channels 3 for guiding a fluid and/or gaseous insulating material.

The insulating material 20 has to be selected, on the one hand, with sufficient dielectric strength in dependence upon the load applied by DC and AC electric fields generated by the enclosed electrical components to avoid breakdown or flashover of the insulating material. On the other hand, the material has to be selected so that it has a desired mechanical strength which, of course, depends on the application, the dimensions and the weight of the whole unit.

A preferred insulating material 20 is for example a hard foam which comprises an additive in the form of another material or a substance for adapting the electric conductivity and/or the dielectric constant of the insulating material, such that voltage drops that occur during the operation of the high field/high voltage unit remain below flashover and/or breakdown voltages of the hard foam.

Such additional material can be formed especially by at least substantially spherical particles within the hard foam which in terms of their size and/or their material and/or their coating and/or their filling and/or their fraction with respect to the overall insulating material 20 are selected and/or dimensioned, respectively, such that a desired electric conductivity and/or dielectric constant of the insulating material 20 is obtained.

The spherical particles are preferably hollow spheres with a diameter of up to about 100 μm which are filled with a gas to achieve in particular a high field strength and a low weight of the high field/high voltage unit.

For this purpose, the spherical particles are preferably formed of glass and/or a ceramic and/or a phenolic resin and/or an acrylonitrile copolymer or another insulating material.

The spherical particles can have a coating consisting of an electrically conductive material, so that the electric conductivity of the hard foam can be set to a desired value in a relatively precise and reproducible manner.

To improve the adhesion between the particles and the hard foam and thus increase the strength and stability of the casing especially for applications in rotary X-ray systems or computer tomography systems, the particles can be coated and/or the hard foam can be mixed, respectively, with a related adhesion promoter.

Additionally, or alternatively, for applications with an especially high dynamic load, the strength and stability of the casing can be increased by intermediate layers of glass fiber mats and/or inserts of metal or steel which are integrated into the insulating material 20.

The piece parts 10, 11 according to FIG. 1 have a substantially U-shaped cross section and are each provided at the ends of their legs with a flange 10*a*, 11*a*, respectively, for combining and connecting together both piece parts 10, 11 to form the casing.

However, the piece parts can be given different shapes and forms as well, e.g. one piece part in the form of a pot and the other piece part in the form of a cover. These forms and shapes mainly have to be selected in dependence upon the number and size of electrical components and interconnections which have to be built into the casing.

In order to achieve a fluid or gas tight casing it is preferred to use a seal between both flanges 10*a*, 11*a*, especially in the form of an O-ring 10*c*, and to press the opposing flanges 10*a*, 11*a* together by means of a screw 10*b* and/or a strong clip or cramp 11*b* or by means of other known devices.

Both piece parts 10, 11 have a closed outer circumference so that they provide the outer surface of the high field/high voltage unit and no extra vessel is necessary. However, in order to especially avoid voltage flashovers or surface discharges, or for other high voltage reasons, the outer surface of the piece parts 10, 11 (and accordingly of the casing) is preferably provided with a reduced electric resistance, for example by means of a semi-conductive coating or paint or a conducting grid e.g. in the form of wires or a grid-like layer, so that a shielding effect and a conducting earth potential is achieved.

The piece parts 10, 11 are provided with an inner structure which comprises a plurality of first recesses which, after assembling together the first and the second piece part 10, 11, complement each other so as to form first cavities having dimensions and being adapted for containing and fixing each at least one electrical component 4 of the high field/high voltage unit.

If a separate electric shield of an electrical component 4 is necessary, the related first recess can be provided with a metallic coating.

Furthermore, second recesses are provided which, after assembling together the first and the second piece part 10, 11, complement each other so as to form second cavities especially in the form of channels 3 for guiding a liquid and/or gaseous insulating material through the casing and especially to and past those electrical components 4 which require increased cooling. Such cooling can be realized effectively if the channels are filled with a fluid or gaseous insulating material like especially a transformer oil. This oil either flows through the channels by convection or it can be pumped through the channels as disclosed in EP 1 176 856A2, which is considered to be incorporated herein by reference. Preferably, the oil is fed through a heat exchanger outside the casing.

The electrical components 4 are selected according to the proposed application of the high field/high voltage unit. These components 4 are active and/or passive electrical components like for example a transformer, a capacitor, a voltage divider, a rectifier, a resistor and so on, or a conductor as well.

Furthermore, a number of such active and/or passive electrical components can be combined e.g. into a mold unit or an integrated or hybrid circuit which itself is considered in this specification as an electrical component 4.

These components 4 are connected with each other by means of electrical interconnections (conductors) according to the circuit layout of the high field/high voltage unit.

These interconnections can for example be provided by means of at least partially conducting areas 5 which can be realized in the form of coatings or layers on the surface of the inner structure of the piece parts 10, 11 and/or which can be realized in the form of conducting channels which run through the piece parts 10, 11. The conducting channels can be formed by injection molding of e.g. a conducting foam into the insulating foam.

Furthermore, the electrical interconnections of the components 4 can be provided by means of metal sticks or wires 6 which run on the surface of the inner structure of the piece parts 10, 11 and/or which are inserted into the insulating material of the piece parts 10, 11 before molding and curing same.

Finally, a foil technology can be applied as well, wherein for example a flexible printed circuit board or a flexible copper foil or layer or stripline is used which is fixed on the inner surface of the piece parts 10, 11 and/or which runs through the piece parts 10, 11 and is introduced before molding and curing same.

The electrical components 4 are preferably press fit or snap mounted within the related first recesses and cavities, respectively. This has the advantages that, on the one hand, no additional carriers have to be used for fixing the components 4 and, on the other hand, the components 4 can be electrically contacted at the same time if contact areas 7, which are preferably resilient or spring contacts, are provided within the recesses and cavities, respectively, against which the components 4 are pressed. Both advantages make the assembly of the high field/high voltage unit considerably easier and faster. Furthermore, the assembly can be conducted to a great extent by machines.

The contact areas 7 themselves can be interconnected by the above-mentioned electrical interconnections 5, 6, wherein the same interconnection technology can be used as disclosed above for the components 4.

The high field/high voltage unit according to FIG. 1 comprises input terminals 21 for applying an input signal or an input voltage to be processed or transformed and output terminals 22 for connecting output plugs 22*a* for feeding the processed and transformed signal, respectively, to other units. According to FIG. 1, the input and output terminals 21, 22 are interconnected via metal sticks 6 running through the outer wall of the casing to contact areas 7 at which related electrical components 4 rest.

The production of this high field/high voltage unit comprises substantially the following steps:

First, the first and the second piece part 10, 11 of the shell or vessel (i.e. the casing) are molded according to known injection molding techniques or pressure gelation techniques or a pressure impregnation process by which the at least substantially spherical particles are impregnated with a fixing agent, preferably a liquid resin, preferably under vacuum. Preferably, the particles have different diameters and are compressed before the resin is injected into the space between the particles, so that they cannot sediment.

By means of one of these molding techniques, said first and second recesses are provided and electrical interconnections in the form of at least partly conductive areas 5 and/or metal sticks or wires 6 are inserted or injected, as mentioned above, before curing of the piece parts 10, 11.

Then the electrical components 4 are mounted within the recesses preferably by press fitting them into the recesses so that they are simultaneously pressed against related contact areas 7 and are electrically contacted.

By means of the next step both piece parts 10, 11 are assembled together according to FIG. 1, and the opposing flanges 10*a*, 11*a* are fastened together by means of screws 10*b* and/or clips 11*b*, as described above.

Finally, the fluid or gaseous insulating material is filled into the casing. Especially in the case of a fluid insulating material, a first opening 23*a* is provided at the bottom of the casing and a second opening 23*b* is provided at its top side, which openings can both be closed by appropriate plugs or other devices. The fluid insulating material is pumped through the first opening 23*a* into the casing, while the second opening 23*b* is open so that the air enclosed within the casing can escape. In order to improve the degassing, this process is preferably conducted under vacuum. Then both openings are closed.

For disassembling the high field/high voltage unit, first the oil is drained through the first opening 23*a* and then the screw 10*b* and/or the clamp 11*b* is released. Now the electrical components 4 can be taken out of the piece parts 10, 11, sorted and disposed accordingly. The piece parts 10, 11 can be cleaned to remove any residual oil and disposed as well.

Generally, the preferred applications of the unit according to the invention are all kinds of high voltage power and transmission systems like e.g. X-ray and computer tomography systems, switch gears and so on, because of the advantages mentioned above.

However, the unit according to the invention can be applied as well for applications in which flashovers between electrical components arranged at small distances from each other have to be avoided. Such applications include especially all kinds of electrical high field units used in the automotive industry and in the aviation industry including the space industry. Especially for these applications (as well as for rotary X-ray and computer tomography systems), the units according to the invention have the advantage of a low weight in combination with a high electric insulation.

The invention claimed is:

1. A high field/high voltage unit comprising at least one electrical component and, as a solid insulating material, a hard foam which is formed to provide an outer shell or vessel of the high field/high voltage unit and which has an inner structure comprising at least one first cavity for accommodating the at least one electrical component.

2. A high field/high voltage unit according to claim 1, wherein the inner structure comprises at least one second cavity for containing a fluid and/or a gaseous insulating material, and wherein the shell or vessel is provided in the form of a liquid- and/or a gas-tight casing.

3. A high field/high voltage unit according to claim 1, wherein the hard foam comprises a plurality of spherical particles with a diameter of up to about 100 μm.

4. A high field/high voltage unit according to claim 1, wherein the shell or vessel is composed at least of a first piece part and a second piece part which are assembled together to form a casing.

5. A high field/high voltage unit according to claim 1, wherein at least one electrical contact area is respectively disposed within the at least one first cavity and is configured for press fitting or snap mounting into connection with the at least one respective electrical component.

6. A high field/high voltage unit according to claim 1, wherein the at least one component is an active and/or passive electrical component like a transformer, a capacitor, a voltage divider, a rectifier, a resistor or a conductor, or a mold unit or an integrated or hybrid circuit comprising at least one such active and/or passive electrical component.

7. A high field/high voltage unit according to claim 1, wherein at least one at least partly conductive interconnection is provided within the casing for electrically connecting the electrical components.

8. A high field/high voltage unit according to claim 7, wherein the interconnection is provided by a metal stick or wire which is inserted into the insulating material.

9. A high field/high voltage unit according to claim 7, wherein the interconnection is provided in the form of at least one flexible printed circuit board and/or a flexible conductive foil which is fixed on the inner surface of the insulating material and/or which runs through it.

10. An X-ray system or computer tomography system comprising the high field/high voltage unit according to claim 1.

11. A high field/high voltage unit comprising at least one electrical component and, as a solid insulating material, a hard foam which is formed to provide an outer shell or vessel of the high field/high voltage unit and which has an inner structure comprising at least one first cavity for accommodating the at least one electrical component, wherein at least one at least partly conductive interconnection is provided within the casing for electrically connecting the electrical components, wherein the interconnection is provided by an at least partly conducting material on the inner surface of and/or within the insulating material.

12. An electrical unit comprising:

a plurality of electrical components; and a solid electrically-insulated hard-foam material which is formed to provide an outer casing of said unit and to assume an inner structure defining a plurality of first cavities for accommodating respective ones of the plural electrical components, said inner structure further defining a second plurality of cavities serving as respective channels for guiding an electrically-insulating material that is at least one of liquid and gaseous.

13. The electrical unit of claim 12, comprising a first piece part and a second, complementary piece part joinable to the first piece part, each piece part having respective inner recesses that, upon the joining, complement each other so as to form said first cavities.

14. A voltage generator as said electrical unit of claim 12.

* * * * *